(12) United States Patent
Kurosawa et al.

(10) Patent No.: US 9,437,429 B2
(45) Date of Patent: Sep. 6, 2016

(54) POLYCRYSTALLINE SILICON MANUFACTURING APPARATUS AND POLYCRYSTALLINE SILICON MANUFACTURING METHOD

(71) Applicant: Shin-Etsu Chemical Co., Ltd., Chiyoda-ku (JP)

(72) Inventors: Yasushi Kurosawa, Niigata (JP); Shigeyoshi Netsu, Niigata (JP); Naruhiro Hoshino, Niigata (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/130,627

(22) PCT Filed: Sep. 20, 2012

(86) PCT No.: PCT/JP2012/005966
§ 371 (c)(1),
(2) Date: Jan. 2, 2014

(87) PCT Pub. No.: WO2013/042361
PCT Pub. Date: Mar. 28, 2013

(65) Prior Publication Data
US 2014/0134832 A1    May 15, 2014

(30) Foreign Application Priority Data

Sep. 20, 2011    (JP) ................. 2011-204665

(51) Int. Cl.
*C23C 16/24*    (2006.01)
*C23C 16/46*    (2006.01)
(Continued)

(52) U.S. Cl.
CPC ....... *H01L 21/02595* (2013.01); *C01B 33/035* (2013.01); *C23C 16/24* (2013.01); *C23C 16/4418* (2013.01); *H01L 21/02532* (2013.01)

(58) Field of Classification Search
CPC ...... C01B 33/035; C01B 33/02; B01J 19/26; B32B 15/043; C23C 16/50; C23C 16/44; C23C 16/24; C23C 16/02; H01L 31/182
USPC .......... 118/723, 725; 427/545, 593; 428/378
See application file for complete search history.

(56) References Cited

U.S. PATENT DOCUMENTS

| 2009/0081380 A1 | 3/2009 | Endoh et al. |
| 2009/0136666 A1* | 5/2009 | Endoh et al. ............ 427/255.18 |

(Continued)

FOREIGN PATENT DOCUMENTS

| CN | 201105990 Y | 8/2008 |
| CN | 102001660 A | 4/2011 |

(Continued)

OTHER PUBLICATIONS

International Search Report Issued Oct. 16, 2012 in PCT/JP12/005966 Filed Sep. 20, 2012.

(Continued)

*Primary Examiner* — Kimberly Rizkallah
*Assistant Examiner* — Brian Turner
(74) *Attorney, Agent, or Firm* — Oblon, McClelland, Maier & Neustadt, L.L.P.

(57) ABSTRACT

In order to obtain a polycrystalline silicon rod having an excellent shape, the placement relation between a source gas supplying nozzle 9 and metal electrodes 10 that are provided in a reactor is appropriately designed. The area of a disc-like base plate 5 is $S_0$. An imaginary concentric circle C (radius c) centered at the center of the disc-like base plate 5 has an area $S = S_0/2$. Further, a concentric circle A and a concentric circle B are imaginary concentric circles having the same center as that of the concentric circle C and having a radius a and a radius b, respectively ($a < b < c$). In the present invention, the electrode pairs 10 are placed inside of the imaginary concentric circle C and outside of the imaginary concentric circle B, and the gas supplying nozzle 9 is placed inside of the imaginary concentric circle A.

5 Claims, 5 Drawing Sheets

(51) Int. Cl.
    *C23C 16/50*     (2006.01)
    *H01L 21/20*     (2006.01)
    *C01B 33/033*     (2006.01)
    *H01L 21/02*     (2006.01)
    *C01B 33/035*     (2006.01)
    *C23C 16/44*     (2006.01)

(56) References Cited

U.S. PATENT DOCUMENTS

| | | |
|---|---|---|
| 2011/0014468 A1 | 1/2011 | Urushihara et al. |
| 2011/0036294 A1* | 2/2011 | Hillabrand et al. ...... 118/723 R |
| 2011/0059004 A1 | 3/2011 | Stocklinger |
| 2011/0229638 A1* | 9/2011 | Qin ................. C01B 33/035 427/255.28 |
| 2011/0274926 A1 | 11/2011 | Oda et al. |

FOREIGN PATENT DOCUMENTS

| | | |
|---|---|---|
| DE | 23 58 053 A1 | 5/1975 |
| JP | 5-139891 | 6/1993 |
| JP | 2002 241120 | 8/2002 |
| JP | 2006 206387 | 8/2006 |
| JP | 2009 107886 | 5/2009 |
| JP | 2010 37180 | 2/2010 |
| JP | 2010 155782 | 7/2010 |
| JP | 2011 37699 | 2/2011 |
| WO | 2010 098319 | 9/2010 |

OTHER PUBLICATIONS

Japanese Office Action issued Sep. 26, 2014, in Japan Patent Application No. 2011-204665.
Office Action dated Aug. 25, 2015 issued in corresponding Japanese patent application No. 2014-235374.
Office Action dated May 21, 2015 issued in corresponding Chinese patent application No. 201280035894.7.

* cited by examiner

POLYCRYSTALLINE SILICON MANUFACTURING APPARATUS AND POLYCRYSTALLINE SILICON MANUFACTURING METHOD

CROSS REFERENCE TO RELATED APPLICATIONS

The present application is a 35, U.S.C. §371, national stage patent application of International patent application PCT/JP2012/005966, filed on Sep. 20, 2012, published as WO/2013/042361, on Mar. 28, 2013, the text of which is incorporated by reference, and claims the benefit of the filing date of Japanese application no. 2011-204665, filed on Sep. 20, 2011, the text of which is also incorporated by reference.

TECHNICAL FIELD

The present invention relates to a technique of manufacturing polycrystalline silicon, and, more specifically, to placement of a source gas supplying nozzle and silicon core fixing electrodes on a base plate of a reactor for manufacturing polycrystalline silicon according to a Siemens method.

BACKGROUND ART

Polycrystalline silicon is used as a raw material for a single-crystal silicon substrate for manufacturing a semiconductor device or a substrate for manufacturing a solar cell. A Siemens method is known as a polycrystalline silicon manufacturing method. The Siemens method is a method including bringing a source gas containing chlorosilane into contact with a heated silicon core and thus vapor-depositing polycrystalline silicon on the surface of the silicon core according to a CVD method, to thereby obtain a silicon rod.

When polycrystalline silicon is vapor-deposited according to the Siemens method, two silicon cores in the vertical direction and one silicon core in the horizontal direction are assembled into a shrine-gate shape in a reactor of a vapor deposition apparatus. Then, both ends of this shrine-gate shaped silicon core structure are fixed to a pair of metal electrodes placed on a base plate of the reactor, by means of a pair of core holders. A supply port of the source gas for causing a reaction and a discharge port of a reaction exhaust gas are also placed on this base plate. Such a configuration is disclosed in, for example, Japanese Patent Laid-Open No. 2010-155782 (Patent Literature 1).

In particular, a polycrystalline silicon rod that is used as a raw material for manufacturing a single-crystal rod according to a floating zone method (FZ method) is required to have an excellent shape. Specifically, the polycrystalline silicon rod is required to have a shape with less warpage and high cross-sectional roundness.

Under the circumstances, various ideas have been made to improve the shape of the polycrystalline silicon rod, and specific methods therefor are disclosed in Japanese Patent Laid-Open No. 2010-155782 (Patent Literature 1) given above, Japanese Patent Laid-Open No. 2006-206387 (Patent Literature 2), Japanese Patent Laid-Open No. 2010-37180 (Patent Literature 3), Japanese Patent Laid-Open No. 2009-107886 (Patent Literature 4), and the like.

In order to improve the shape of the polycrystalline silicon rod, it is necessary to uniform environments such as the reaction gas temperature, the reaction gas concentration, and the reaction gas flow speed around silicon cores during a reaction. In conventional techniques, the number of gas supplying nozzles is increased, or the positional relation between the gas supplying nozzles and the silicon cores is favorably adjusted, whereby the environments around the silicon cores are made uniform. As a result, improvement in shape quality of the polycrystalline silicon rod is achieved.

Meanwhile, in recent years, polycrystalline silicon is produced on a large scale. Consequently, in order to enhance the productivity through a rapid reaction, it is necessary to increase the reaction pressure in the reactor and supply a large amount of chlorosilane as a raw material into the reactor (see, for example, Japanese Patent Laid-Open No. 2011-37699 (Patent Literature 5)).

CITATION LIST

Patent Literature

Patent Literature 1: Japanese Patent Laid-Open No. 2010-155782
Patent Literature 2: Japanese Patent Laid-Open No. 2006-206387
Patent Literature 3: Japanese Patent Laid-Open No. 2010-37180
Patent Literature 4: Japanese Patent Laid-Open No. 2009-107886
Patent Literature 5: Japanese Patent Laid-Open No. 2011-37699

SUMMARY OF INVENTION

Technical Problem

As described above, in order to achieve a rapid reaction for the purpose of enhancement in productivity in the case of manufacturing a polycrystalline silicon rod according to the Siemens method, it is necessary to supply a larger amount of source gas into the reactor, but the shape of the polycrystalline silicon rod grown under such environments tends to be low in uniformity. That is, rapid growth of the polycrystalline silicon rod and improvement in shape (warpage, cross-sectional roundness, fluctuations in cross-sectional diameter, and the like) of the polycrystalline silicon rod are in a trade-off relation.

The reason for this can be described in the following manner, for example.

A portion in which environmental conditions such as the temperature, the concentration, and the flow speed of the reaction gas flow in the reactor are remarkably different from those of other portions is estimated as a jet portion of the source gas blown out of each gas supplying nozzle. The source gas supplied from the gas supplying nozzle has a chlorosilane concentration higher than that of the circulating reaction gas in the reactor, and is blown out as a jet flow into the reactor. Generally, the source gas is supplied into the reactor at a temperature of approximately 200° C. to 400° C., and this temperature is lower than a gas temperature of 400° C. to 600° C. in the reactor. The source gas supplied into the reactor is mixed with the circulating reaction gas therearound while weakening its jet speed, and comes into contact with the surface of the polycrystalline silicon rod (having a surface temperature of 950° C. to 1,100° C.) during a deposition reaction, so that the temperature of the source gas becomes 400° C. to 600° C.

That is, the source gas blown out of the gas supplying nozzle is higher in flow speed, lower in temperature, and higher in chlorosilane concentration than the circulating reaction gas in the reactor. In order to enhance the productivity, it is necessary to increase the amount of supplied source gas. Unfortunately, if a large amount of such a source gas is supplied into the reactor, the flow state of the reaction gas circulating in the reactor is likely to be disturbed, and it becomes difficult to keep environments on the surface of the polycrystalline silicon rod in a uniform and stable state. Under such conditions, warpage of the polycrystalline silicon rod is likely to be large, and the cross-sectional roundness thereof is likely to be low.

The present invention, which has been made in view of the above mentioned problems, has an object to provide a technique of enabling obtaining a polycrystalline silicon rod having an excellent shape with less warpage and high cross-sectional roundness, without any decrease in production efficiency.

Solution to Problem

In order to achieve the above-mentioned object, a polycrystalline silicon manufacturing apparatus according to the present invention is a polycrystalline silicon manufacturing apparatus for manufacturing polycrystalline silicon according to a Siemens method, the apparatus including a reactor whose inside is sealed by a bell jar and a disc-like base plate. The base plate is provided with: electrode pairs for holding a plurality of silicon cores and applying current to the silicon cores; and at least one gas supplying nozzle for supplying a source gas to a space inside of the bell jar. The electrode pairs are placed inside of an imaginary concentric circle C having a radius c and outside of an imaginary concentric circle B having a radius b that is smaller than the radius c, the imaginary concentric circles C and B being imaginary concentric circles centered at a center of the base plate, the imaginary concentric circle C having an area S ($=S_0/2$) that is half an area $S_0$, of the disc-like base plate, the imaginary concentric circle B having the same center as that of the concentric circle C. The gas supplying nozzle is placed inside of an imaginary concentric circle A having a radius a that is smaller than the radius b, the imaginary concentric circle A having the same center as that of the concentric circle C. A difference between the radius b and the radius a is equal to or more than 20 cm and equal to or less than 50 cm.

Preferably, the above-mentioned polycrystalline silicon manufacturing apparatus further includes a gas flow rate controlling unit that supplies the source gas into the bell jar at a given flow rate. The gas flow rate controlling unit enables the source gas blown out of the gas supplying nozzle to be controlled at a flow speed of 150 m/sec or higher.

A polycrystalline silicon manufacturing method according to the present invention includes: using the above-mentioned polycrystalline silicon manufacturing apparatus according to the present invention; placing the gas supplying nozzle such that a source gas blown out of the gas supplying nozzle does not directly hit against a surface of polycrystalline silicon deposited on the silicon cores; and depositing the polycrystalline silicon.

Further, a polycrystalline silicon manufacturing method according to the present invention includes: using the above-mentioned polycrystalline silicon manufacturing apparatus according to the present invention; blowing a source gas out of the gas supplying nozzle at a flow speed of 150 m/sec or higher; and depositing polycrystalline silicon on surfaces of the silicon cores.

Advantageous Effects of Invention

The polycrystalline silicon manufacturing apparatus according to the present invention is designed such that: the electrode pairs are placed inside of the imaginary concentric circle C and outside of the imaginary concentric circle B; the gas supplying nozzle is placed inside of the imaginary concentric circle A; and the difference between the radius b of the imaginary concentric circle B and the radius a of the imaginary concentric circle A is equal to or more than 20 cm and equal to or less than 50 cm. Hence, polycrystalline silicon rods are placed in a portion of a circulating flow after sufficient mixing of gases. As a result, environments on the surfaces of the polycrystalline silicon rods such as the reaction gas temperature, the reaction gas concentration, and the reaction gas flow speed can be kept in a uniform and stable state. Accordingly, it is possible to obtain polycrystalline silicon rods each having an excellent shape with less warpage and high cross-sectional roundness, without any decrease in production efficiency.

DESCRIPTION OF EMBODIMENTS

Hereinafter, an embodiment of the present invention is described with reference to the drawings.

Figure 1:
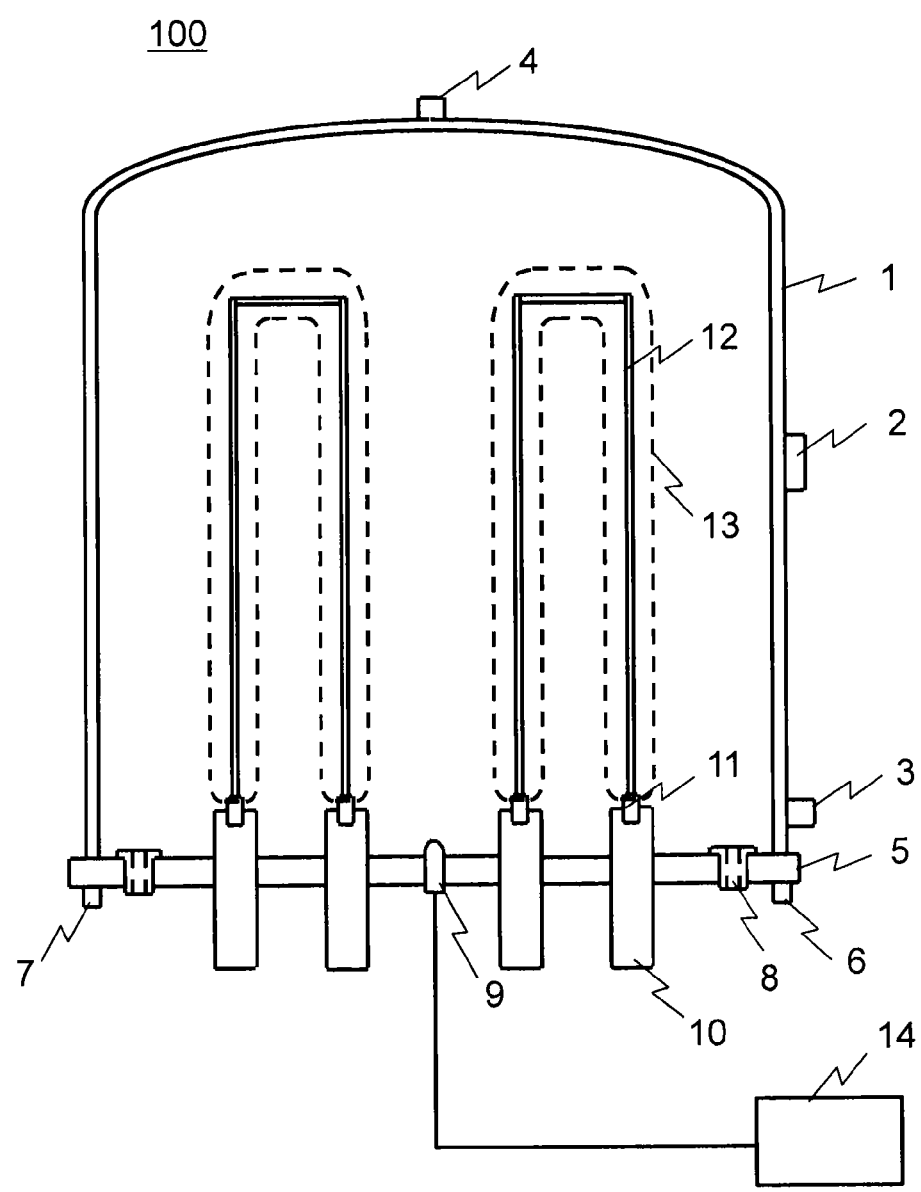
FIG. 1 is a cross-sectional schematic diagram for describing a configuration example of a reactor for manufacturing polycrystalline silicon according to the present invention.

FIG. 1 is a cross-sectional schematic diagram for describing a configuration example of a reactor included in a polycrystalline silicon manufacturing apparatus according to the present invention. The inside of a reactor 100 is sealed by a bell jar 1 and a base plate 5, and the bell jar 1 includes an observation window 2 for checking a state of the inside thereof. A plurality of silicon cores 12 each assembled into a shrine-gate shape are placed in this sealed space, and polycrystalline silicon is deposited on the surfaces of the silicon cores (or silicon rods 13). Core holders 11, metal electrodes 10, a nozzle 9, and reaction exhaust gas ports 8 are set on the base plate 5. The core holders 11 and the metal electrodes 10 serve to apply current to both ends of the silicon cores 12 and thus generate heat. The nozzle 9 serves to supply a source gas into the bell jar 1. The reaction exhaust gas ports 8 serve to discharge a reacted gas to the outside of the bell jar 1. Note that the source gas whose flow speed and flow rate have been controlled by a gas flow rate controlling unit 14 is supplied from a blow-out port of the nozzle 9. Further, in FIG. 1, only one nozzle 9 is illustrated, but a plurality of the nozzles 9 may be provided.

Normally, the base plate 5 has a disc-like shape, and the metal electrodes 10, the nozzle(s) 9, and the reaction exhaust gas ports 8 are provided on the base plate 5 are set on concentric circles in many cases. A mixed gas of trichlorosilane and hydrogen is used as the source gas in many cases, and the reaction temperature is as relatively high as 900° C. to 1,200° C. Accordingly, a refrigerant inlet 3 and a refrigerant outlet 4 are respectively provided in a lower portion and an upper portion of the bell jar 1, and a refrigerant inlet 6 and a refrigerant outlet 7 are provided at both ends of the base plate 5. A refrigerant is supplied to a refrigerant path of each of the bell jar 1 and the base plate 5, whereby the bell jar 1 and the base plate 5 are cooled. Note that water is generally used as such a refrigerant. Further, the inner surface temperature of the bell jar 1 during a deposition reaction is approximately 100° C. to 400° C.

Figure 2:
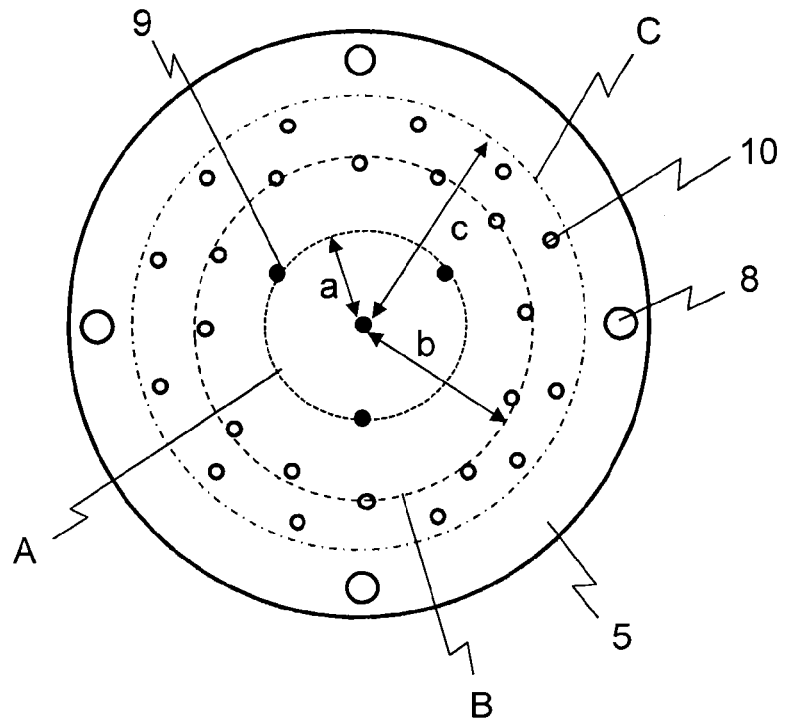
FIG. 2 is a top schematic diagram of a base plate for describing, by way of example, a state of the placement relation between source gas supplying nozzles and metal electrodes (electrode pairs) that are provided in the reactor included in a polycrystalline silicon manufacturing apparatus according to the present invention.

FIG. 2 is a top schematic diagram of the base plate 5 for describing, by way of example, a state of the placement relation between the source gas supplying nozzles 9 and the metal electrodes (electrode pairs) 10 that are provided in the reactor included in the polycrystalline silicon manufacturing apparatus according to the present invention.

In the drawings, an alternate long and short dash line with reference sign C denotes an imaginary concentric circle (radius c) centered at the center of the disc-like base plate 5, and this imaginary concentric circle has an area $S=S_0/2$ that is half an area $S_0$ of the base plate 5. Further, alternate long and short dash lines with reference sign A and reference sign B respectively denote imaginary concentric circles having the same center as that of the concentric circle C and having a radius a and a radius b (a<b<c).

In the present invention, the electrode pairs 10 are placed inside of the imaginary concentric circle C and outside of the imaginary concentric circle B, and the gas supplying nozzles 9 are all placed inside of the imaginary concentric circle A.

Note that such a mode as illustrated in FIG. 1 in which only one gas supplying nozzle 9 is provided is possible, and the above-mentioned placement relation is maintained even in this mode.

Figure 3:
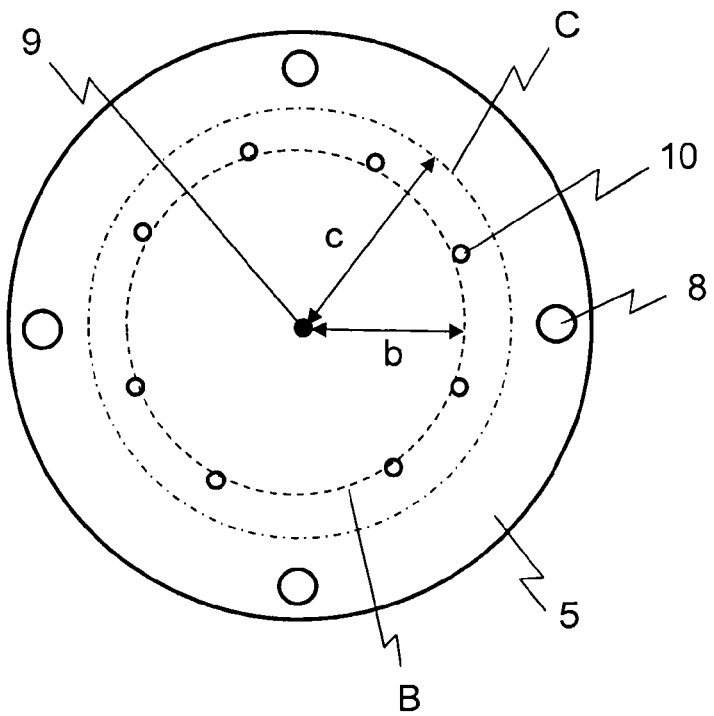
FIG. 3 is a top schematic diagram of a base plate for describing, by way of example, a state of the case where only one source gas supplying nozzle is provided.

FIG. 3 is a top schematic diagram of the base plate 5 for describing, by way of example, a state of the placement relation between the source gas supplying nozzle 9 and the metal electrodes (electrode pairs) 10, in the mode in which only one source gas supplying nozzle 9 is provided. In this case, the gas supplying nozzle 9 is provided at the center of the disc-like base plate 5. This mode can be understood as the case where the radius of the imaginary concentric circle A is zero (a=0).

In a process of manufacturing polycrystalline silicon, it is preferable that the source gas blown out of the gas supplying nozzle 9 be favorably adjusted so as not to directly hit against the surface of the polycrystalline silicon 13 deposited on each silicon core 12. For this reason, it is important to make such design that a difference (b−a) in radius between the imaginary concentric circle B and the imaginary concentric circle A falls within an appropriate range, the difference (b−a) serving as an index of how close to each other the source gas nozzle 9 and the electrode pairs 10 are. Although the appropriate difference in radius depends on the shape of the gas supplying nozzle 9 and the like, it is preferable that the value of (b−a) be set to be equal to or more than 20 cm, in the case of using a commonly used nozzle. Further, from the perspective of effective utilization of the space inside of the reactor, it is preferable that the value of (b−a) be set to be equal to or less than 50 cm.

Figure 4:
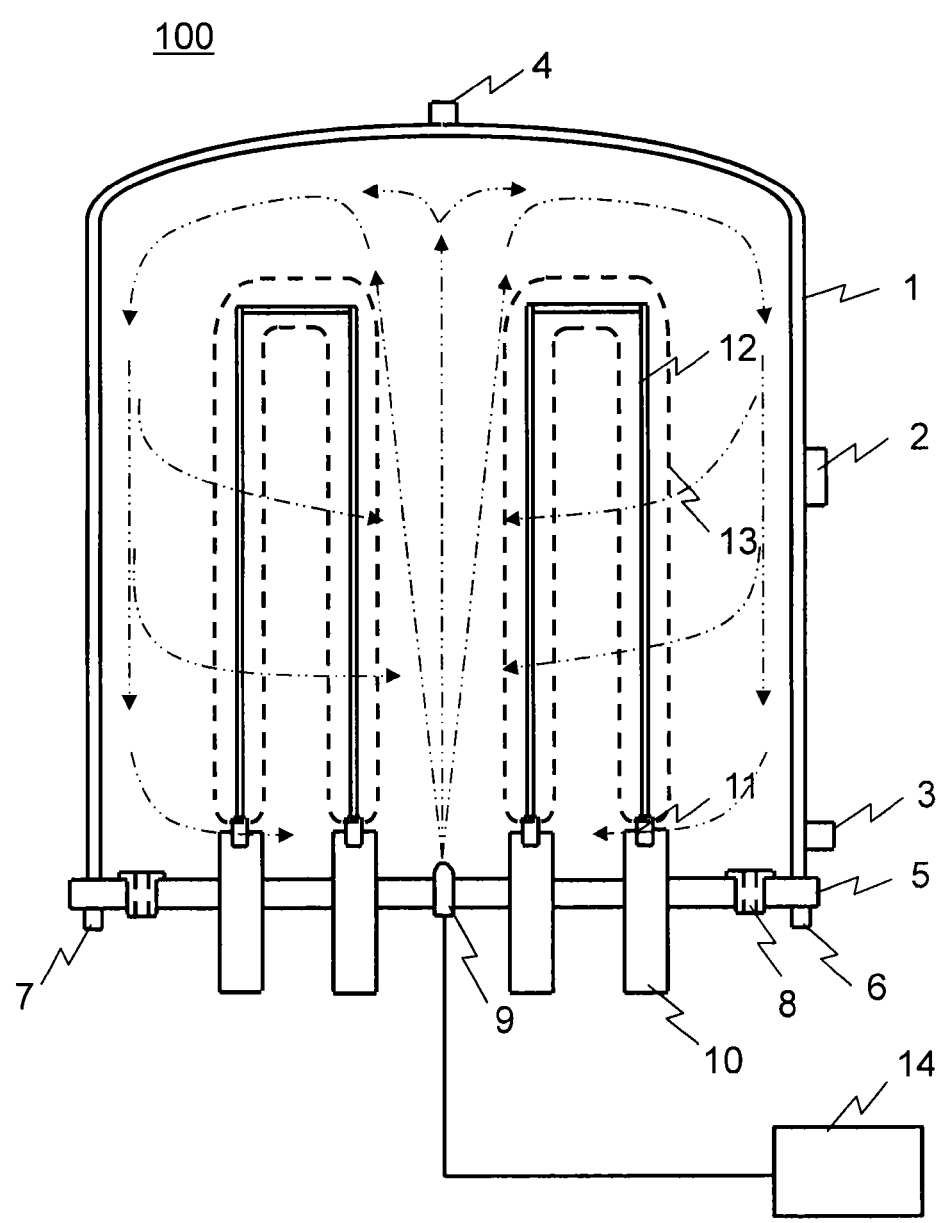
FIG. 4 is a diagram for schematically describing a flow in the reactor, of a reaction gas blown out of the gas supplying nozzle.

FIG. 4 is a diagram for schematically describing a flow in the bell jar 1, of a reaction gas blown out of the gas supplying nozzle 9 that is placed so as to satisfy the above-mentioned relation. Note that this figure schematically illustrates the gas flow in the case where only one gas supplying nozzle 9 is provided and where the source gas is supplied from the gas supplying nozzle 9 at 150 m/sec or more.

As illustrated in this figure, the source gas that is blown out of the gas supplying nozzle 9 placed in the above-mentioned mode and has a high flow speed moves upward while involving the reaction gas therearound, collides against the inner top wall of the bell jar 1 to change its flow to a downward direction, and moves downward as a circulating flow along the inner side wall of the bell jar. Part of the downward gas flow moves upward again in the reaction space together with the source gas blown out of the gas supplying nozzle 9. In this way, an upward current region and a downward current region become clear in the entire reactor, and a smooth circulating flow is formed.

Further, as illustrated in this figure, in the present invention, the gas supplying nozzle 9 is placed such that the source gas blown out of the gas supplying nozzle 9 does not directly hit against the surface of the polycrystalline silicon 13 deposited on each silicon core 12. The source gas that has moved upward to the top portion of the bell jar 1 hits against the ceiling portion and spreads. On the way, the source gas is well mixed with the reaction gas circulating therearound in the reactor. Hence, the temperature of the mixed gas becomes substantially uniform, and the mixed gas moves toward the lower portion of the reactor as a downward flow. Then, the downward flow reaches around the region in which the polycrystalline silicon rods 13 are set, and is mixed again with the source gas. Such a gas flow also applies to the case where the plurality of gas supplying nozzles 9 are provided.

That is, the polycrystalline silicon manufacturing apparatus according to the present invention is designed such that: the electrode pairs 10 are placed inside of the imaginary concentric circle C and outside of the imaginary concentric circle B; the gas supplying nozzles are placed inside of the imaginary concentric circle A; and the difference between the radius b of the imaginary concentric circle B and the radius a of the imaginary concentric circle A is equal to or more than 20 cm and equal to or less than 50 cm. In the polycrystalline silicon manufacturing apparatus thus designed, in the case where the reaction gas flow in the reactor during a reaction is projected for observation from above the bell jar onto the base plate 5, an upward current is generated inside of the imaginary concentric circle A, an upward current is generated on average inside of the imaginary concentric circle C, and a downward current is generated on average outside of the imaginary concentric circle C. Then, the polycrystalline silicon rods 13 are placed in a portion of the circulating flow after sufficient mixing of gases as described above, and hence environments on the surfaces of the polycrystalline silicon rods such as the reaction gas temperature, the reaction gas concentration, and the reaction gas flow speed can be kept in a uniform and stable state.

Note that, in order to keep the circulating gas in the reactor in an excellent mixed state, it is preferable that the blow-out speed of the source gas from the gas supplying nozzle 9 be set to be equal to or more than 150 m/sec.

With the use of the polycrystalline silicon manufacturing apparatus thus configured, even if a large amount of source gas is supplied into the reactor, the flow state of the reaction gas circulating in the reactor is less likely to be disturbed, and it becomes easy to keep environments on the surfaces of the polycrystalline silicon rods in a uniform and stable state. Further, warpage of the polycrystalline silicon rods can be suppressed from occurring, and the cross-sectional roundness thereof can be suppressed from decreasing.

EXAMPLES

In Example 1, polycrystalline silicon rods were grown according to the placement in the mode illustrated in FIG. 3

(the number of gas supplying nozzles=1), in which the radius of the imaginary concentric circle B was 20 cm.

Further, in Example 2, polycrystalline silicon rods were grown according to the placement in the mode illustrated in FIG. 2 (the number of gas supplying nozzles=4), in which the radii of the imaginary concentric circles A and B were a=20 cm and b=45 cm, respectively (b−a=25 cm).

Figure 5:
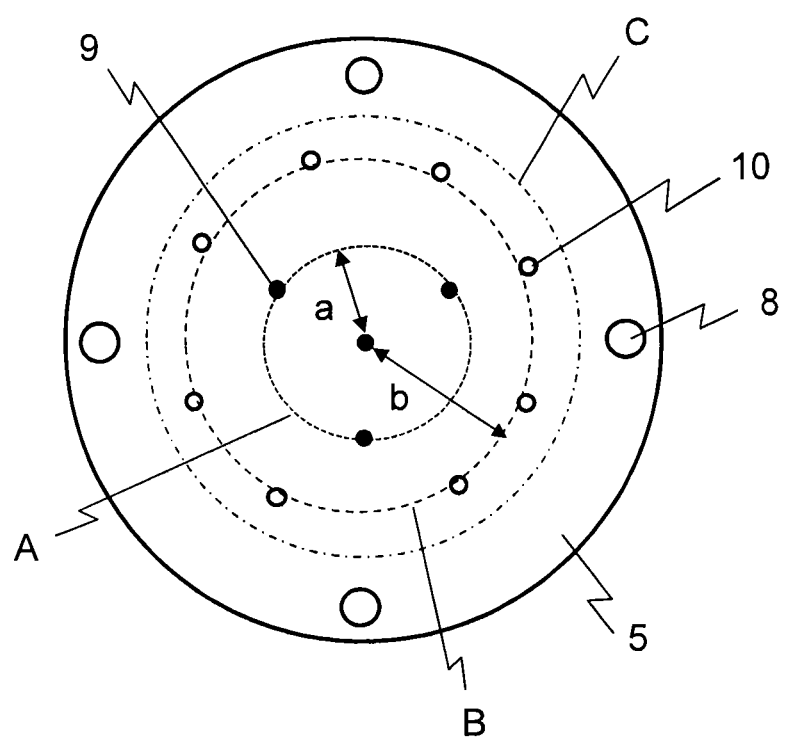
FIG. 5 is a top schematic diagram for describing a state of a base plate according to Comparative Example 1.

Furthermore, in Comparative Example 1, polycrystalline silicon rods were grown according to the placement in the mode illustrated in FIG. 5 (the number of gas supplying nozzles=4), in which the radii of the imaginary concentric circles A and B were a=45 cm and b=55 cm, respectively (b−a=10 cm).

Note that, in these examples, the polycrystalline silicon rods were grown under the same conditions other than the placement relation between the gas supplying nozzle(s) and the electrode pairs. Table 1 and Table 2 show the growth conditions of the polycrystalline silicon rods and evaluation results of the shapes and the like of the obtained polycrystalline silicon rods. Note that the values shown in Table 2 were obtained for each placement relation from a polycrystalline silicon rod having the worst shape based on results obtained by measuring all the polycrystalline silicon rods other than polycrystalline silicon rods that cracked or collapsed during a reaction and thus could not secure an effective length (1.8 m).

TABLE 1

| Conditions | Example 1 | Example 2 | Comparative Example 1 |
|---|---|---|---|
| Base Plate Placement | FIG. 3 | FIG. 2 | FIG. 5 |
| Reaction Temperature | 1050° C. | 1050° C. | 1050° C. |
| Reaction Pressure | 0.5 MPaG | 0.5 MPaG | 0.5 MPaG |
| Type of Source Gas | Trichlorosilane Hydrogen | Trichlorosilane Hydrogen | Trichlorosilane Hydrogen |
| Concentration of Source Gas | 20% | 20% | 20% |
| Final Diameter of Silicon Rod | 130 mmφ | 130 mmφ | 130 mmφ |
| Flow Speed of Source Gas Supply | 170 m/sec | 170 m/sec | 170 m/sec |

TABLE 2

| Shapes and the Like | Example 1 | Example 2 | Comparative Example 1 |
|---|---|---|---|
| Length | 1.80 m | 1.82 m | 1.83 m |
| Average Diameter | 132 mm | 135 mm | 134 mm |
| Warpage | 3 mm | 4 mm | 15 mm |
| Cross-Sectional Roundness | 5 mm | 5 mm | 9 mm |
| (Minimum Diameter) | 129 mm | 132 mm | 125 mm |
| Taper | 6 mm | 7 mm | 12 mm |
| (Minimum Diameter) | 129 mm | 132 mm | 125 mm |

In both Examples 1 and 2, the warpage is smaller, and the cross-sectional roundness is more excellent, compared with Comparative Example 1. Comparing Example 2, in which the difference in radius between the imaginary concentric circles A and B falls within a range of 20 to 50 cm, with Comparative Example 1, in which the difference in radius therebetween does not fall within the range, can prove that the difference in radius therebetween influences the shape of each polycrystalline silicon rod. This is based on the following reason. In the case where the difference in radius therebetween does not fall within the range, the source gas blown out of the gas supplying nozzle directly hits against the surface of each polycrystalline silicon rod. Hence, the reaction temperature of this portion drops, and the growth of the polycrystalline silicon is suppressed. As a result, the shape of each polycrystalline silicon rod becomes worse.

Figure 6:
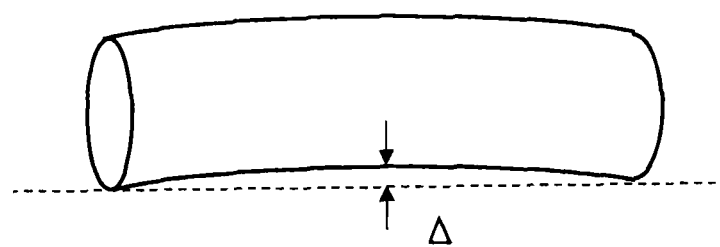
FIG. 6 is a conceptual diagram for describing warpage (A).
Figure 7:
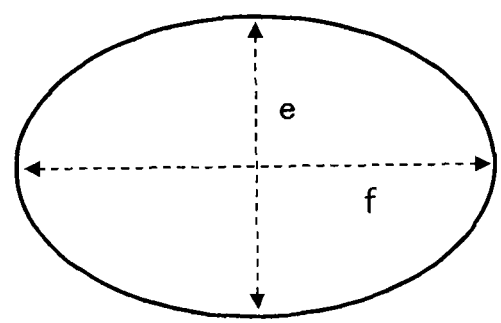
FIG. 7 is a conceptual diagram for describing roundness (f/e).
Figure 8:
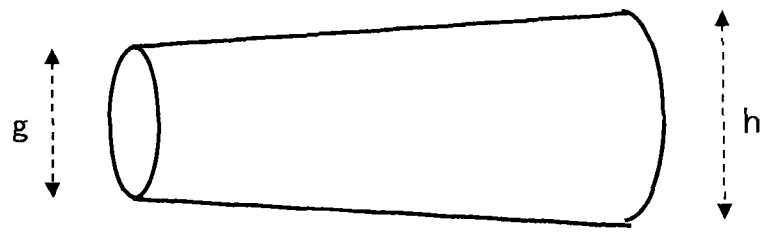
FIG. 8 is a conceptual diagram for describing taper (g/h).

Note that FIGS. 6 to 8 are conceptual diagrams for describing the warpage (Δ), the roundness (f/e), and the taper (g/h), respectively.

INDUSTRIAL APPLICABILITY

With the use of the polycrystalline silicon manufacturing apparatus according to the present invention, even if a large amount of source gas is supplied into the reactor, the flow state of the reaction gas circulating in the reactor is less likely to be disturbed, and it becomes easy to keep environments on the surfaces of the polycrystalline silicon rods in a uniform and stable state. Further, warpage of the polycrystalline silicon rods can be suppressed from occurring, and the cross-sectional roundness thereof can be suppressed from decreasing.

REFERENCE SIGNS LIST

100 reactor
1 bell jar
2 observation window
3 refrigerant inlet (bell jar)
4 refrigerant outlet (bell jar)
5 base plate
6 refrigerant inlet (base plate)
7 refrigerant outlet (base plate)
8 reaction exhaust gas ports
9 gas supplying nozzle
10 electrode
11 core holder
12 silicon core
13 polycrystalline silicon rod
14 gas flow rate controlling unit
A, B, C imaginary concentric circle
a radius of imaginary concentric circle A
b radius of imaginary concentric circle B
c radius of imaginary concentric circle C

The invention claimed is:
1. A polycrystalline silicon manufacturing apparatus comprising a reactor whose inside is sealed by a bell jar and a disc-like base plate, wherein
the base plate comprises: electrode pairs adapted for holding a plurality of silicon cores and applying current to the silicon cores; and at least one gas supplying nozzle adapted for supplying a source gas to a space inside of the bell jar,
all of the electrode pairs are located inside of an imaginary concentric circle C having a radius c and outside of an imaginary concentric circle B having a radius b that is smaller than the radius c, the imaginary concentric circles C and B being imaginary concentric circles centered at a center of the base plate, the imaginary concentric circle C having an area S ($=S_0/2$) that is half an area $S_0$ of the disc-like base plate, the imaginary concentric circle B having the same center as that of the concentric circle C, all of the gas supplying nozzle is located inside of an imaginary concentric circle A having a radius a that is smaller than the radius b, the imaginary concentric circle A having the same center as that of the concentric circle C, a difference between the radius b and the radius a is in a range of 20 cm to 50 cm, and one of the gas supplying nozzles is located at the center of the base plate.

2. The polycrystalline silicon manufacturing apparatus according to claim 1, further comprising a gas flow rate controlling unit adapted to supply the source gas into the bell jar at a given flow rate, wherein the gas flow rate controlling unit enables the source gas blown out of the gas supplying nozzle to be controlled at a flow speed of 150 m/sec or higher.

3. A polycrystalline silicon manufacturing method comprising:

disposing the gas supplying nozzle of the polycrystalline silicon manufacturing apparatus according to claim 2 such that a source gas blown out of the gas supplying nozzles does not directly hit against a surface of polycrystalline silicon deposited on the silicon cores; and depositing polycrystalline silicon.

4. A polycrystalline silicon manufacturing method comprising:

disposing the gas supplying nozzle of the polycrystalline silicon manufacturing apparatus according to claim 1 such that a source gas blown out of the gas supplying nozzles does not directly hit against a surface of polycrystalline silicon deposited on the silicon cores; and depositing polycrystalline silicon.

5. A polycrystalline silicon manufacturing method comprising:

blowing a source gas out of the gas supplying nozzle of the polycrystalline silicon manufacturing apparatus according to claim 2 at a flow speed of 150 m/sec or higher; and depositing polycrystalline silicon on surfaces of the silicon cores.

* * * * *